(12) United States Patent
Chu et al.

(10) Patent No.: US 8,729,525 B2
(45) Date of Patent: May 20, 2014

(54) OPTO-ELECTRONIC DEVICE

(75) Inventors: Jui-Yi Chu, Hsinchu (TW); Cheng-Ta Kuo, Hsinchu (TW); Yu-Pin Hsu, Hsinchu (TW); Chun-Kai Wang, Hsinchu (TW); Hsin-Hsien Wu, Hsinchu (TW); Yi-Chieh Lin, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 617 days.

(21) Appl. No.: 12/547,073

(22) Filed: Aug. 25, 2009

(65) Prior Publication Data
US 2010/0046205 A1    Feb. 25, 2010

(30) Foreign Application Priority Data

Aug. 25, 2008  (TW) .................. 97132545 A

(51) Int. Cl.
*H01L 29/06*    (2006.01)
*H01L 33/06*    (2010.01)

(52) U.S. Cl.
CPC ..................................... *H01L 33/06* (2013.01)
USPC ............................................. 257/13; 257/14

(58) Field of Classification Search
CPC ....... H01L 25/67; H01L 27/153; H01L 33/06; H01L 33/007; H01L 33/0075; H01L 33/325; H01L 33/505; H01L 33/641
USPC ......................................... 257/13, 14, 95–103
See application file for complete search history.

(56) References Cited

U.S. PATENT DOCUMENTS

| | | | |
|---|---|---|---|
| 5,684,309 A * | 11/1997 | McIntosh et al. | 257/191 |
| 7,254,150 B2 * | 8/2007 | Yoshida et al. | 372/43.01 |
| 7,258,816 B2 * | 8/2007 | Tamaki et al. | 252/301.4 F |
| 2004/0184496 A1 * | 9/2004 | Kneissl et al. | 372/45 |

FOREIGN PATENT DOCUMENTS

| | | |
|---|---|---|
| CN | 1353867 A | 6/2002 |
| TW | 200607113 | 2/2006 |
| TW | 200733428 | 9/2007 |

* cited by examiner

*Primary Examiner* — Brook Kebede
(74) *Attorney, Agent, or Firm* — Muncy, Geissler, Olds & Lowe, P.C.

(57) ABSTRACT

The present application relates to an opto-electronic device. The opto-electronic device includes an n-cladding layer, a p-cladding layer and a multi-quantum well structure. The multi-quantum well structure is located between the p-cladding layer and the n-cladding layer, and includes a plurality of barrier layers, a plurality of well layers and a barrier tuning layer. The barrier tuning layer is made by doping the barrier layer adjacent to the p-cladding layer with an impurity therein for changing an energy barrier thereof to improve the light extraction efficiency of the opto-electronic device.

10 Claims, 4 Drawing Sheets

US 8,729,525 B2

OPTO-ELECTRONIC DEVICE

BACKGROUND

1. Technical Field

This application discloses an opto-electronic device and more particularly to the light-emitting device having a multi-quantum well structure.

2. Reference to Related Application

This application claims the right of priority based on TW application Ser. No. 097132545, filed Aug. 25, 2008, entitled "OPTO-ELECTRONIC DEVICE", and the contents of which are incorporated herein by reference.

3. Description of the Related Art

The light-emitting diodes (LEDs) have the characteristics of small volume, long operational life, low driving voltage, low power consumption, quick response, and shockproof so the LEDs have been widely used in cars, computers, communications, and consumer electronics products.

Generally speaking, the light emitting diodes (LEDs) have an active layer sandwiched by two cladding layers having different conductivity type (for example, the p-type and the n-type cladding layers). When applying a driving voltage to the contact electrodes located on the two cladding layers, the electrons and the holes from the two cladding layers will be injected into the active layer, and combine in the active layer to generate light. The light is omnidirectional and is extracted from every surface of the light emitting diodes. Usually, the active layer can be a single quantum well structure or a multi-quantum well structure. Comparing to the single quantum well structure, the multi-quantum well structure has better opto-electronic converting efficiency. It can convert current into light through a small bandgap structure alternately arranged by many quantum barrier layers and many quantum well layers even when the input current is small.

However, the multi-quantum well structure is easily influenced by the carrier overflow effects and the piezoelectric field effect which makes it difficult to limit the electrons and holes in the multi-quantum well structure efficiently for combination so the light extraction efficiency of the light emitting diodes can't be improved efficiently.

SUMMARY

The present application relates to an opto-electronic device. The opto-electronic device includes an n-cladding layer, a p-cladding layer and a multi-quantum well structure. The multi-quantum well structure is located between the p-cladding layer and the n-cladding layer, and includes a plurality of barrier layers, a plurality of well layers and a barrier tuning layer. The barrier tuning layer is made by doping the barrier layer adjacent to the p-cladding layer with an impurity therein for changing an energy barrier.

In one embodiment of this application, the energy barrier of the barrier tuning layer is larger than that of other barrier layers. The dopant of the barrier tuning layer is Al, and the thickness of the barrier tuning layer can be smaller than that of other barrier layer or smaller or equal to 90 Å.

In one embodiment of this application, the energy barrier of the barrier tuning layer is smaller than that of other barrier layers. The dopant of the barrier tuning layer is In, and the barrier tuning layer can be a single layer or multiple layers.

The opto-electronic device as described above, by having the barrier tuning layer adjacent to the p-type cladding layer, the energy barrier is different from that of other barrier layers in the active layer. The barrier tuning layer can increase the opportunity of the combination of the electrons and the holes to increase the light extraction efficiency.

BRIEF DESCRIPTION OF THE DRAWINGS

The accompanying drawings are included to provide easy understanding of the application, and are incorporated herein and constitute a part of this specification. The drawings illustrate embodiments of the application and, together with the description, serve to illustrate the principles of the application.

DESCRIPTION OF THE PREFERRED EMBODIMENTS

Figure 1:
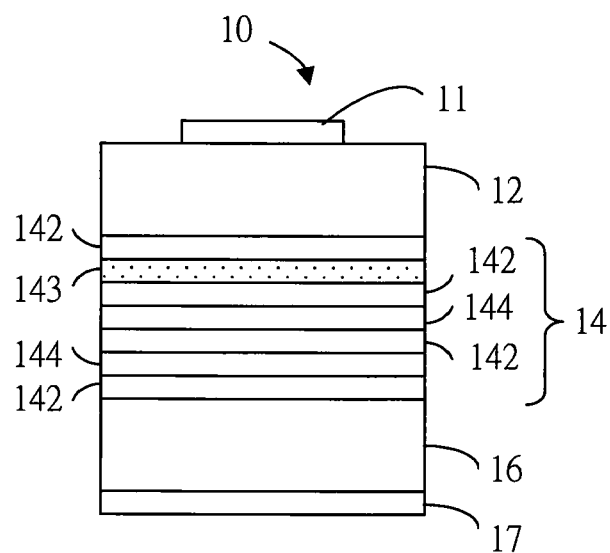
FIG. 1 is a schematic illustration of the structure of the opto-electronic device with multi-quantum well active layer in according with the first embodiment of this application.

Reference is made in detail to the preferred embodiments of the present application, examples of which are illustrated in the accompanying drawings. Wherever possible, the same reference numbers are used in the drawings and the description to refer to the same or like parts.

FIG. 1 is a schematic illustration of the structure of the opto-electronic device with multi-quantum well active layer in according with the first embodiment of this application. The opto-electronic device 10 is a light-emitting diode device having a p-type cladding layer 12, an n-type cladding layer 16, an active layer 14 formed between the p-type cladding layer 12 and the n-type cladding layer 16, a first contact electrode 11 formed on the p-type cladding layer 12 and a second contact electrode 17 contacted with the n-type cladding layer 16. The active layer 14 is alternately arranged by a plurality of well layers 142 and a plurality of barrier layers 144. A barrier tuning layer 143 is formed by doping the barrier layer adjacent to the p-cladding layer 12 with an impurity therein for changing the energy barrier of such barrier layer. When applying a driving voltage to the contact electrodes 11,17, the electrons and holes form the p-type cladding layer 12 and the n-type cladding layer 16 are injected into the active layer 14, and combined in the active layer to generate light.

Figure 2:
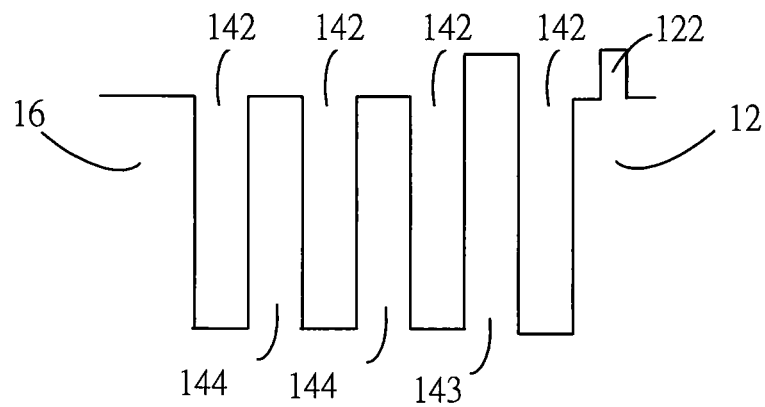
FIG. 2 is an illustration of the bandgap distribution of the opto-electronic device described in FIG. 1.

The material of the p-type cladding layer 12, the n-type cladding layer 16 and the active layer 14 can be a GaN series semiconductor. For example, the p-type cladding layer 12 can be a p-type GaN, the n-type cladding layer 16 can be a n-type GaN, the well layers 142 of the active layer 14 can be GaInN, and the barrier layers 144 of the active layer 14 can be GaN. Furthermore, as shown in FIG. 2, a high energy barrier zone 122 can be formed in an area in the p-cladding layer 12 that is near the active layer 14. The high energy barrier zone 122 is formed by doping an impurity of Al.

In this embodiment, the active layer 14 has at least four layers of well layer 142, two layers of barrier layer 144, and one layer of barrier tuning layer 143. Comparing to the other barrier layers 144 in the active layer 14, the distance between the barrier tuning layer 143 and the p-type cladding layer is smaller. The energy barrier of the barrier tuning layer 143 and the other barrier layers 144 in the active layer 14 is different. In a preferred embodiment, the energy barrier of the barrier tuning layer 143 is larger than the barrier layers 144. As shows in FIG. 2, the barrier tuning layer can be a GaN barrier layer doped with Al.

Comparing to the other barrier layers 144 in the active layer 14, the barrier tuning layer 143 have a higher energy barrier. The barrier tuning layer 143 can limit the hole carriers flow from the quantum well adjacent to the p-type cladding layer 12, and can further increase the combination opportunity of the electrons and holes so the light extraction efficiency of the opto-electronic device 10 is increased. Besides, the barrier tuning layer 143 is doped with Al and formed as GaAlN. Because the lattice constant of the GaAlN is smaller than GaN, and the lattice constant of GaInN quantum well is larger than GaN, the barrier tuning layer 143 doped with Al can have the lattice constant of the equivalent quantum well easily matched with GaN. It decreases the influence of the piezo-electric field effect to the quantum well, raises the internal quantum effect, and increases the light extraction efficiency of the opto-electronic device 10.

Figure 3:
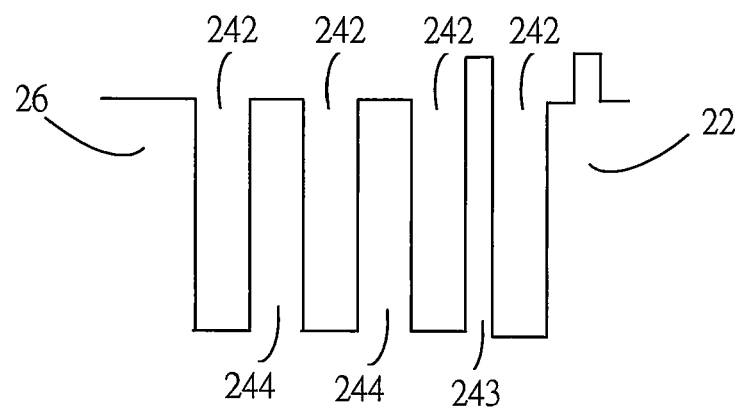
FIG. 3 is an illustration of the bandgap distribution of the opto-electronic device with multi-quantum well active layer in according with the second embodiment of this application.

FIG. 3 is an illustration of the bandgap distribution of the opto-electronic device in according with the second embodiment of this application. The structure of this embodiment is similar to the opto-electronic device 10 in the first embodiment. The structure includes a p-type cladding layer 22, an n-type cladding layer 26, and an active layer 24 formed between the p-type cladding layer 22 and the n-type cladding layer 26. The active layer 24 includes a plurality of well layers 242, a plurality of barrier layers 244, and a barrier tuning layer 243 wherein the energy barrier of the barrier tuning layer 243 is larger than that of the barrier layer 244. The difference is that the thickness of the barrier tuning layer 243 is smaller than the thickness of the barrier layer 244. The thickness of the barrier tuning layer 243 can be smaller or equal to 90 Å. The smaller thickness of the barrier tuning layer 243 can further increase the light extraction efficiency of the opto-electronic device; for example, when the thickness of the barrier tuning layer is about 90 Å, the light extraction efficiency of the opto-electronic device is 89%.

Figure 4:
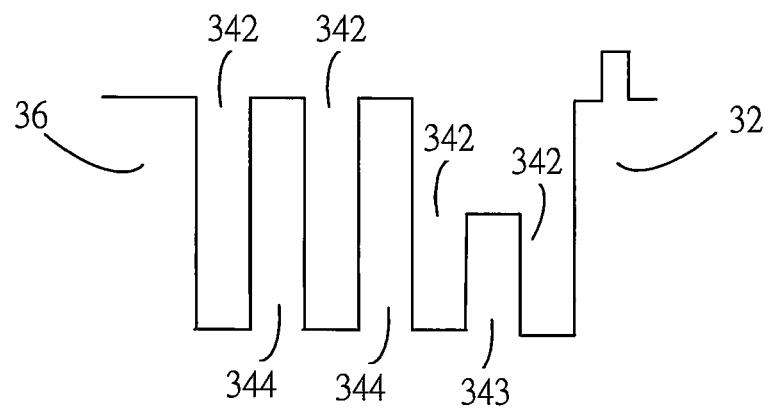
FIG. 4 is an illustration of the bandgap distribution of the opto-electronic device with multi-quantum well active layer in according with the third embodiment of this application.

FIG. 4 is an illustration of the bandgap distribution of the opto-electronic device in according with the third embodiment of this application. The structure of this embodiment is similar with the opto-electronic device 10 in the first embodiment. The structure includes a p-type cladding layer 32, an n-type cladding layer 36, and an active layer 34 formed between the p-type cladding layer 32 and the n-type cladding layer 36. The active layer 34 includes a plurality of well layers 342, a plurality of barrier layers 344 and a barrier tuning layer 343. The difference is that the energy barrier of the barrier tuning layer 343 is smaller than that of the barrier layers 344. The barrier tuning layer 343 is doped with In to form GaInN. Comparing to other barrier layers 344 in the active layer 34, the barrier tuning layer has a smaller energy barrier, and can increase the combination opportunity for the electrons and holes in the barrier tuning layer 343 so the light extraction efficiency of the opto-electronic device is increased and can reach to 93%.

Figure 5:
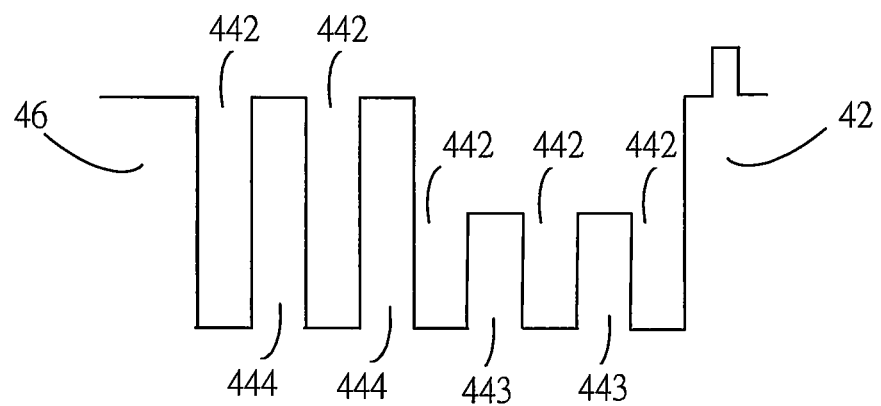
FIG. 5 is an illustration of the bandgap distribution of the opto-electronic device with multi-quantum well active layer in according with the fourth embodiment of this application.

FIG. 5 is an illustration of the bandgap distribution of the opto-electronic device in according with the fourth embodiment of this application. The structure of this embodiment is similar to the opto-electronic device 10 in the first embodiment. The structure includes a p-type cladding layer 42, an n-type cladding layer 46, and an active layer 44 formed between the p-type cladding layer 42 and the n-type cladding layer 46. The active layer 44 is alternately arranged by a plurality of well layers 442 and a plurality of barrier layers 444. The difference is that two barrier layers that closed to the p-type cladding layer 42 are doped with the impurity material such as In to change the energy barrier so a multiple layers structure of the barrier tuning layer 443 is formed. The light extraction efficiency of the opto-electronic device having a barrier tuning layer with multiple layers can reach 83%. The number of the layers of the barrier tuning layer can be more than two, and the doped material can be Al to make the energy barrier of the barrier tuning layer larger than that of the energy barrier of the barrier layer.

Figure 6:
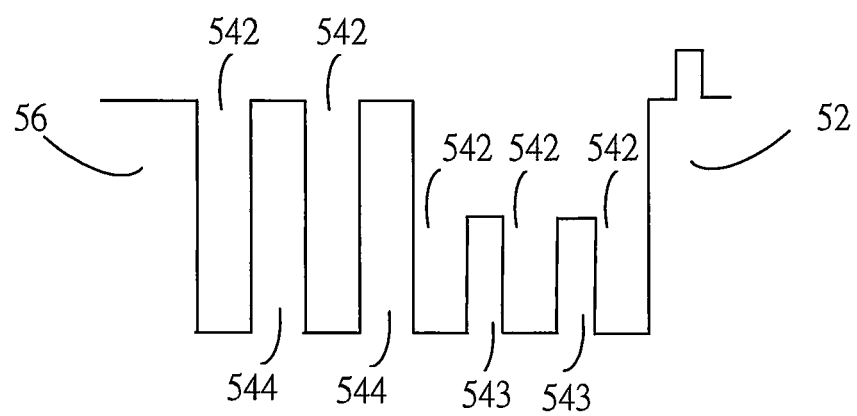
FIG. 6 is an illustration of the bandgap distribution of the opto-electronic device with multi-quantum well active layer in according with the fifth embodiment of this application.

FIG. 6 is an illustration of the bandgap distribution of the opto-electronic device in according with the fifth embodiment of this application. The structure of this embodiment is similar with the opto-electronic device 10 in the fourth embodiment. The structure includes a p-type cladding layer 52, an n-type cladding layer 56, and an active layer 54 formed between the p-type cladding layer 52 and the n-type cladding layer 56. The active layer 54 is formed by well layers 542, barrier layers 544 and barrier tuning layer 543. The difference is that the thickness of each barrier tuning layer 543 is smaller than the thickness of the barrier layer 544.

As described above, because the energy barrier of the barrier tuning layer adjacent to the p-type cladding layer is different to that of other barrier layers of the opto-electronic device in this application, the barrier tuning layer can increase the combination opportunity of the electrons and holes and increase the light extraction efficiency.

Figure 7:
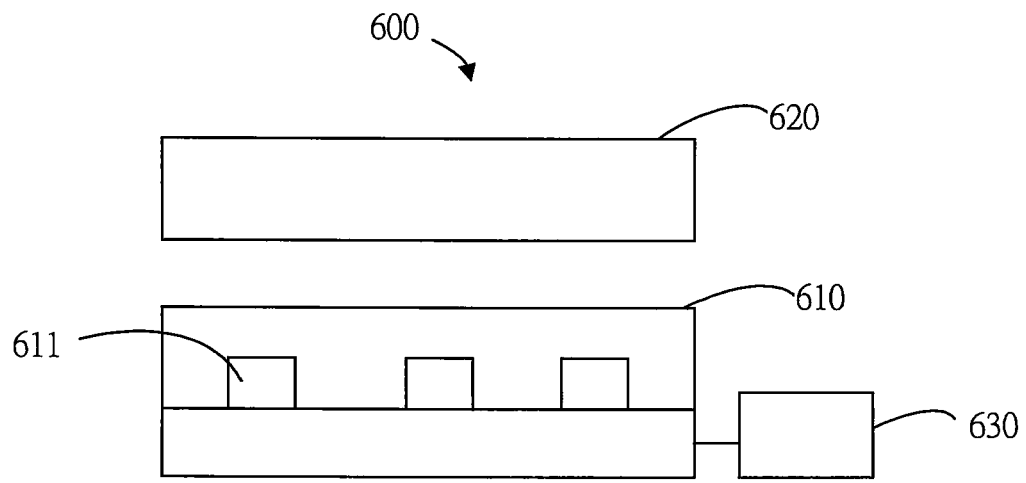
FIG. 7 is an illustration of the backlight module of the present application.

FIG. 7 shows a backlight module structure in according to the application, wherein the backlight module structure 600 including: a light source device 610 having an opto-electronic device 611 made according to any embodiments of this application, an optics device 620 deposited on the light extraction pathway of the light source device 610 to make a proper arrangement before the light extraction. A power supplement system 630 to supply power to the light source device 610 described above.

Figure 8:
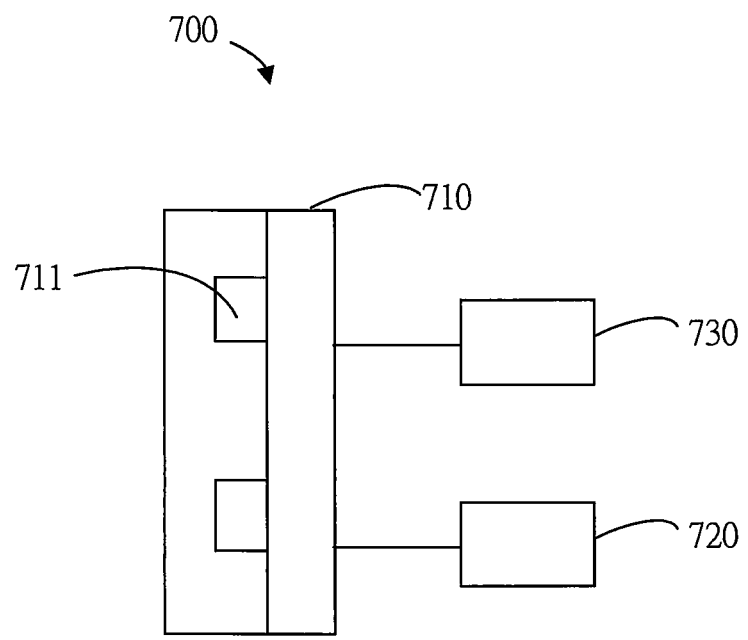
FIG. 8 is an illustration of the lighting device of the present application.

FIG. 8 shows a lighting device in according to the application, wherein the lighting device 700 is a car lamp, a street light, a flashlight, an indicator light, etc. The lighting device 700 includes: a light source device 710 having an opto-electronic device 711 made according to any embodiment of this application described above, a power supplement system 720 to supply power to the light source device 710 described above, and a control element to control the current driven into the light source device 710.

It should be noted that the proposed various embodiments are not for the purpose to limit the scope of the invention. Any possible modifications without departing from the spirit of the invention may be made and should be covered by the application.

What is claimed is:

1. An opto-electronic device comprising:
   an n-type cladding layer;
   a p-type cladding layer comprising a high energy barrier zone; and
   an active layer formed between the n-type cladding layer and the p-type cladding layer, and comprising:
      a plurality of barrier layers;
      a well layer between the plurality of barrier layers and the p-type cladding layer; and
      a barrier tuning layer formed between the plurality of barrier layers and the well layer, and having an energy barrier different from those of the plurality of barrier layers.

2. The opto-electronic device according to claim 1, wherein the n-type cladding layer, the p-type cladding layer, or the active layer comprises GaN series semiconductor.

3. The opto-electronic device according to claim 1, wherein the barrier tuning layer has a thickness not greater than 90 Å.

4. The opto-electronic device according to claim 1, wherein the barrier tuning layer comprises In.

5. The opto-electronic device according to claim 1, wherein the barrier tuning layer is formed in a structure of a single layer or multiple layers.

6. The opto-electronic device according to claim 1, wherein the p-cladding layer comprises a high energy barrier zone being adjacent to the active layer.

7. The opto-electronic device according to claim 6, wherein the high energy barrier zone is doped with Al.

8. The opto-electronic device according to claim 1, wherein the barrier tuning layer and the high energy barrier zone comprise an identical element.

9. A backlight module structure comprising:
- a light source device having an opto-electronic device made according to claim 1;
- an optics device deposited on the light extraction pathway of the light source device; and
- a power supplement system to supply power to the light source device.

10. A lighting device comprising:
- a light source device having an opto-electronic device made according to claim 1
- a power supplement system to supply power to the light source device; and
- a control element to control the current driven into the light source device.

* * * * *